(12) United States Patent
Taguwa

(10) Patent No.: US 6,800,543 B2
(45) Date of Patent: Oct. 5, 2004

(54) SEMICONDUCTOR DEVICE HAVING A LOW-RESISTANCE GATE ELECTRODE

(75) Inventor: Tetsuya Taguwa, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/302,245

(22) Filed: Nov. 22, 2002

(65) Prior Publication Data
US 2003/0170942 A1 Sep. 11, 2003

(30) Foreign Application Priority Data
Nov. 29, 2001 (JP) ........................... 2001-364745

(51) Int. Cl.[7] .................. H01L 21/3205; H01L 21/44
(52) U.S. Cl. .................... 438/592; 438/652; 438/653; 438/655; 438/656; 438/658; 438/664; 438/683
(58) Field of Search ................... 438/585, 592, 438/595, 652–656, 658–660, 663, 664, 683, 768

(56) References Cited

U.S. PATENT DOCUMENTS

| 4,782,033 | A | * | 11/1988 | Gierisch et al. | ............ 438/199 |
| 5,190,888 | A | * | 3/1993 | Schwalke et al. | ........... 438/228 |
| 5,350,698 | A | * | 9/1994 | Huang et al. | ............... 438/305 |
| 5,441,904 | A | * | 8/1995 | Kim et al. | ................... 438/592 |
| 6,277,719 | B1 | * | 8/2001 | Chern et al. | ................ 438/585 |
| 6,306,743 | B1 | * | 10/2001 | Lee | ............................ 438/592 |
| 2001/0018262 | A1 | * | 8/2001 | Hu | ............................. 438/592 |

FOREIGN PATENT DOCUMENTS

JP      11-233451 A      8/1999      .......... H01L/21/28

OTHER PUBLICATIONS

Wolf, Ph.D., Stanley, "Hot–Carrier–Resistant Processing and Device Structures," Silicon Processing for the VLSI Era—vol. 3: The Submicron MOSFET, Lattice Press, 1995, pp. 595–598.*

* cited by examiner

Primary Examiner—Mary Wilczewski
Assistant Examiner—Toniae M. Thomas
(74) Attorney, Agent, or Firm—Hayes Soloway P.C.

(57) ABSTRACT

A gate electrode structure in a semiconductor device has a doped polysilicon (DOPOS) film, a tungsten silicide film, a tungsten silicide nitride film, a tungsten nitride film and a tungsten film consecutively as viewed from the substrate. The tungsten silicide nitride film is formed between the tungsten silicide film and the tungsten nitride film by a plurality of heat treatments. The tungsten silicide nitride film has a small thickness of 2 to 5 nm and has a lower interface resistance for achieving a low-resistance gate electrode, suited for a higher-speed operation of the semiconductor device.

13 Claims, 4 Drawing Sheets

SEMICONDUCTOR DEVICE HAVING A LOW-RESISTANCE GATE ELECTRODE

BACKGROUND OF THE INVENTION

1. Field of the Invention

The present invention relates to a semiconductor device having a lower-resistance gate electrode and a method for manufacturing such a semiconductor device.

2. Description of the Related Art

In large-scale integrated circuits (LSIs), a variety of gate structures are developed in order to realize a gate electrode having a lower resistance for achieving a higher operational speed. For example, a metallic gate electrode made of aluminum (Al) deposited on a gate oxide film has the advantage of lower resistance. However, this metallic gate electrode suffers from the disadvantage of lower heat resistance at higher temperature ranges. Thus, such a gate electrode is not suited for a self-alignment structure where the gate electrode must be formed before a thermal treatment at a higher temperature.

A silicon gate electrode made of doped polysilicon (DOPOS) formed on a gate oxide film is also known as a low-resistance gate electrode. Such a DOPOS gate electrode can be formed on the gate oxide film at an earlier stage of a fabrication process for the semiconductor device, for example, directly after formation of the gate oxide film, whereby it is suited for the self-alignment process. The DOPOS gate electrode has an additional advantage that contamination of the gate oxide film by dusts can be prevented; however, it has the advantage of a higher sheet resistance of the DOPOS and there is an inevitable limit on achieving a lower-resistance gate electrode.

There is also a known low-resistance gate electrode having a polycide structure, wherein a high-melting-point metal (refractory metal) silicide layer is deposited on a thin DOPOS film formed on a gate oxide film, for achieving a lower-resistance gate electrode. The polycide gate electrode has the advantages of higher heat resistance which is suited for the self-alignment process, a non-reaction property of the polycide gate with the gate oxide film and so on. However, the polycide gate structure also has the disadvantage of higher sheet resistance, and thus there is a limit on the achievement of a low-resistance gate electrode.

Another gate electrode structure is also known for achieving a lower-resistance gate electrode, wherein a refractory metal layer such as made of tungsten is formed on a thin DOPOS film. This gate electrode structure has lower sheet resistance compared to the silicon gate electrode, thereby improving the response speed of a MOS device. However, in this structure, the refractory metal layer reacts with the DOPOS film to form a silicide of the refractory metal, such as $WSi_2$, similar to the polycide gate structure, and accordingly, there is a limit on further reduction of the resistance of the gate electrode. In addition, there are other disadvantages of reduction in the impurity concentration of the DOPOS film and diffusion of the metallic atoms from the refractory metal layer.

Patent Publication JP-A-11-233451 describes a technique for suppressing the reaction between the refractory metal layer and the DOPOS film at a high temperature range by interposing therebetween a refractory metal nitride layer. In the described technique, a heat treatment is conducted after the refractory metal nitride layer is formed on the DOPOS film, thereby removing the excessive nitrogen component in the refractory metal nitride layer and converting the entire refractory metal nitride layer into a refractory metal silicide nitride layer.

In the technique described in the publication, the heat treatment conducted to the refractory metal nitride layer formed on the DOPOS film causes a strong reaction between the refractory metal nitride layer and the DOPOS film, whereby a thick refractory metal silicide nitride layer is formed. Although the refractory metal silicide nitride layer generally has a higher barrier function, a higher thickness for the refractory metal silicide nitride layer has a tendency to suppress the reduction in the resistance of the gate electrode structure, because the refractory metal silicide nitride layer has a higher interface resistance depending on the composition and the film structure thereof. Thus, there is a limit on the reduction in the resistance of the gate electrode.

SUMMARY OF THE INVENTION

In view of the above problem in the conventional techniques, it is an object of the present invention to provide a method for manufacturing a semiconductor device having a low-resistance gate electrode structure including a DOPOS film and a refractory metal silicide nitride layer.

It is another object of the present invention to provide such a semiconductor device.

The present invention provides a method for manufacturing a gate electrode in a semiconductor device, including the steps of: forming a layer structure including a doped polysilicon (DOPOS) film, a silicide film including a first refractory metal, a nitride film including the first refractory metal, and a metallic film including a second refractory metal, consecutively as viewed from a substrate; and heat treating the layer structure as a whole.

The present invention also provides a semiconductor device including a substrate, and a gate electrode structure overlying the substrate, the gate electrode structure including a doped polysilicon (DOPOS) film, a silicide film including a first refractory metal, a nitride film including the first refractory metal, and a metallic film including a second refractory metal, consecutively as viewed form the substrate.

In accordance with the semiconductor device manufactured by the method of the present invention and the semiconductor device of the present invention, the refractory metal silicide nitride film formed in the gate electrode structure by the heat treatment conducted to the gate electrode structure as a whole has a smaller thickness compared to the conventional refractory metal silicide nitride film, and thus has a smaller interface resistance, thereby achieving a higher operational speed for the semiconductor device.

PREFERRED EMBODIMENTS OF THE INVENTION

Now, the present invention is more specifically described with reference to the accompanying drawings.

Figure 1A:
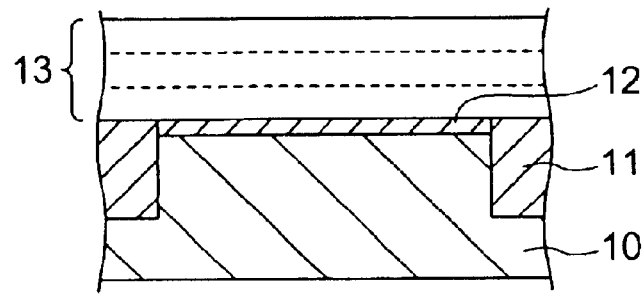
FIGS. 1A to 1F are sectional views of a semiconductor device according to an embodiment of the present invention during consecutive steps of fabrication process thereof.

Referring to FIGS. 1A to 1F, there are shown consecutive steps of the fabrication process of a semiconductor device according to an embodiment of the present invention. As shown in FIG. 1A, a LOCOS layer (or element isolation oxide film) 11 is selectively formed on a surface region of a silicon substrate 10 for isolation of the area of the silicon substrate 10 into a plurality of isolated regions, followed by heat treating the resultant wafer in a chamber in a steam and oxygen ambient at a temperature of 850 degrees C. for four hours to form a 4-nm-thick gate oxide film 12 in each isolated region of the surface of the silicon substrate 10.

Subsequently, a 100-nm-thick DOPOS film 13 is formed on the gate oxide film 12 by a heat treatment conducted for an hour. The heat treatment is such that the DOPOS film 13 is formed on a silicon wafer maintained at a temperature of 580 degrees C. in a mixture gas ambient wherein monosilane ($SiH_4$) and phosphine ($PH_3$) are introduced at flow rates of 3000 sccm and 70 sccm, respectively, while maintaining the chamber pressure at 100 Pa. By this procedure, the DOPOS film 13 has a phosphorus concentration of 2E20 atoms/$cm^3$.

The DOPOS film 13, as shown by dotted lines in FIG. 1A, has a three-layer structure wherein the crystal structure has three different orientations, which structure is obtained by a three-stage deposition of polysilicon. The DOPOS film 13 having such a crystal structure acts as a diffusion stopper for preventing the tungsten atoms in a tungsten layer to be formed later thereon from diffusing toward the silicon substrate 10.

Figure 1B:
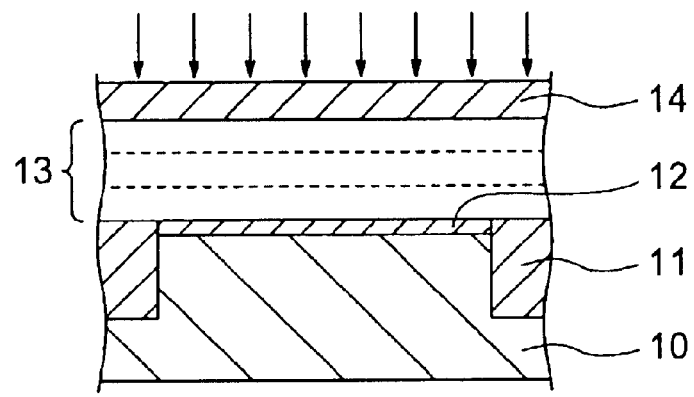

The DOPOS film 13 is then washed by a mixture liquid of hydrofluoric acid (HF) and aqueous hydrogen peroxide ($H_2O_2$) to remove a native oxide film etc. which may be formed on the surface thereof. Thereafter, as shown in FIG. 1B, a tungsten silicide ($WSi_2$) film 14 is formed on the DOPOS film 13 by a CVD technique.

In the deposition of the $WSi_2$ film on the DOPOS film 13, a sputtering technique may be used instead of the CVD technique. In the deposition step, the silicon substrate 10 is heated up to a temperature of 450 degrees C. in the deposition chamber, and thermally reacted for 30 seconds in a mixture gas ambient, wherein dichlorosilane ($SiH_2Cl_2$) and tungsten hexafluoride ($WF_6$) are introduced at flow rates of 200 sccm and 2 sccm, respectively.

The preferable thickness of the $WSi_2$ film 14 is 3 to 20 nm for achieving a desirable interface resistance between the DOPOS film 13 and a tungsten nitride (WN) film to be formed later on the $WSi_2$ film 14. A larger thickness above 20 nm for the $WSi_2$ film makes it difficult to pattern the gate electrode structure as a whole and may cause peel-off of a metallic film to be formed overlying the $WSi_2$ film 14. On the other hand, a lower thickness below 3 nm for the $WSi_2$ film 14 causes a larger mechanical stress acting on the gate oxide film 12 due to aggregation etc. of $WSi_2$ during a high-temperature heat treatment thereof, to thereby degrade the reliability of the gate oxide film 12, which tendency generally appears more likely at a smaller thickness of the gate oxide film 12.

The impurities in the $WSi_2$ film has a diffusion coefficient higher than the impurities in silicon by an order of three to six digits of magnitude. Accordingly, depending on the thickness of the WSi2 film and the process conditions of the high-temperature heat treatment, the impurities in the DOPOS film 13 may be absorbed by the $WSi_2$ film 14 to cause reduction in the impurity concentration of the interface between the $WSi_2$ film 14 and the DOPOS film 13 thereby increasing the interface resistance. For prevention of such a reduction in the interface resistance, impurities such as phosphorous (P) and arsenic (As) should be additionally introduced to the DOPOS film 13 penetrating through the $WSi_2$ film 14 after deposition thereof, or the DOPOS film 13 should have a higher impurity concentration during the deposition thereof.

In this embodiment, the additional introduction of the impurities, phosphorous, is conducted for the DOPOS film 13, after the deposition of the $WSi_2$ film 14, at an acceleration energy of 10 keV and a dosage of 5E15 atoms/$cm^2$. This introduction improves the heat resistance of the $WSi_2$ film 14 and prevents peel-off of the overlying films during a heat treatment in the process for forming the gate electrode structure.

Subsequently, the $WSi_2$ film 14 is subjected to an outgassing treatment to remove the residual gas in the $WSi_2$ film 14. It is to be noted that a larger thickness of the $WSi_2$ film 14 formed by the CVD technique is likely to cause accumulation of the residual gas in the vicinity of the upper interface of the $WSi_2$ film 14 during the heat treatment conducted after the gate electrode structure is formed. The accumulation of the residual gas degrades the adherence between the $WSi_2$ film 14 and the overlying film to cause a peel-off of the overlying film or an increase of the interface resistance.

A rapid thermal anneal (RTA) treatment for 60 seconds is used in the embodiment as the outgassing heat treatment, while introducing a mixture gas of argon (Ar) and nitrogen ($N_2$) or ammonium ($NH_3$). The RTA treatment should be preferably conducted at a temperature equal to or above 700 degrees C. or more preferably equal to or above 850 degrees C. in view of the outgassing efficiency.

A higher temperature above 1000 degrees C. or a longer treating time length above 60 seconds for the RTA treatment may cause additional diffusion of impurities from the DOPOS film 13, which may increase the interface resistance of the DOPOS film 13 and the $WSi_2$ film 14 or change the threshold voltage of the resultant MOSFET due to the change of the impurity concentration of the DOPOS film 13. The outgassing heat treatment also achieves stabilization of the films already formed at that time, i.e., activation of the impurities in the DOPOS film 13, recovery of the crystalline structure of the DOPOS film 13 and crystallization of the $WSi_2$ film 14. The interface between the $WSi_2$ film 14 and the DOPOS film 13 thus formed has an ohmic characteristic of the interface resistance in the relationship between the applied voltage and the induced current. The interface resistance of a sample had a sheet resistance as low as 200 $\Omega$-$\mu m^2$ as will be described later.

Subsequently, a pretreatment is conducted before sputtering of tungsten and tungsten nitride. The pretreatment is such that the surface of the $WSi_2$ film 14 is washed for 30 seconds by using hydrofluoric acid to etch the native oxide film on the $WSi_2$ film 14. The pretreatment should be preferably conducted for a time length corresponding to removal of a thermal oxide film having a thickness of around 1 nm. A smaller time length for the etching does not effectively remove the native oxide film, degrading the adherence of the electrode material on the $WSi_2$ film 14. On the other hand, a larger time length for the etching degrades the morphology of the surface of the $WSi_2$ film 14, thereby affecting the property of the electrode material formed later thereon to cause defects such as increase of the line resistance.

Figure 1C:
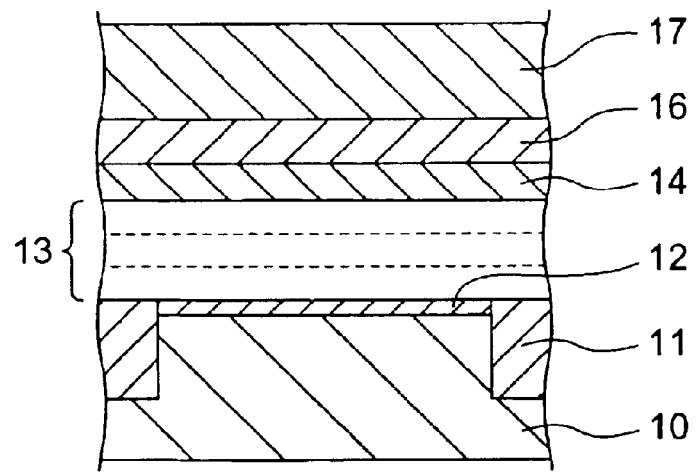

Subsequently, as shown in FIG. 1C, a 10-nm-thick tungsten nitride film (WN) 16 and a 80-nm-thick tungsten (W) film 17 are consecutively sputtered onto the surface of the WSi$_2$ film 14 after washing thereof by using hydrofluoric acid. A CVD technique may be used instead for depositing the tungsten nitride film 16 and the tungsten film 17.

The tungsten nitride (WNx) film 16 has a lower bond energy among other nitrides, is likely to generate WSiN, and acts as a diffusion barrier layer which prevents an undesired reaction of the tungsten atoms after diffusion thereof from the tungsten film 17 toward the DOPOS film 13 and an undesired reaction of the impurities such as phosphorous after diffusion thereof from the DOPOS film 13 toward the tungsten film 17. The tungsten film 17 has a small thickness and yet provides a lower resistance for the gate electrode structure.

For deposition of the tungsten nitride film 16 and the tungsten film 17, the silicon substrate 10 is heated up to a temperature of 200 degrees C. in a vacuum chamber which receives therein a tungsten target, followed by introduction of a mixture gas wherein argon gas and nitrogen gas are introduced at flow rates of 40 sccm and 60 sccm, respectively. While maintaining the internal pressure of the vacuum chamber at 1330 Pa, a DC electric field is applied at a power of 800 mW to generate plasma for sputtering the tungsten target. The tungsten atoms sputtered from the tungsten target reacts with the active nitrogen in the plasma and is deposited on the WSi$_2$ film 14 as a tungsten nitride (WN) film 16. The WN film 16 preferably has a thickness of 5 to 200 nm, and a thickness of 10 nm for the WN film 16 is obtained by a time length of 20 seconds for the sputtering. A smaller thickness below 5 nm for the WN film 16 degrades the barrier property of the WN film 15 and a larger thickness above 20 nm makes it difficult to pattern the same. It is to be noted that the WSi$_2$ film 14 underlying the WN film 16 includes phosphorous ions at a suitable concentration to have a lower sheet resistance for achieving an excellent current path.

In view that the heat resistance of the tungsten nitride film 16 is affected by the composition thereof, the atomic ratio (x) of tungsten to nitrogen in the tungsten nitride (WxN) film 16 is preferably 0.8 to 2.0 and more preferably 1.4 to 1.9. If x is selected around 1.7, desorption of nitrogen atoms can be suitably suppressed during the RTA treatment even at a higher temperature rise as high as 1000° C./60 seconds.

For example, if the WN layer 16 is directly formed on the DOPOS film 13 differently from the above embodiment, an amorphous compound (WSiN) layer including nitrogen and silicon and having a higher barrier function is formed to an excessively larger thickness. The excessively larger thickness increases the interface resistance between the WN film 16 and the DOPOS film 13 however. In the present embodiment, since the WN film 16 is formed on the DOPOS film 13 with an intervention of the WSi$_2$ film 14, the amorphous compound film has a smaller thickness because of stabilization of bonds between the tungsten and silicide. Thus, the increase of the interface resistance caused by the amorphous compound layer between the tungsten nitride film 16 and the WSi$_2$ film 14 can be suppressed.

Following the deposition of the tungsten nitride film 16, a tungsten film 17 is deposited thereon. In this step, introduction of nitrogen gas into the chamber is stopped, and the DC power is increased up to 1500 watts, while generating plasma only by using argon gas. This deposition is conducted for 40 seconds to form a tungsten nitride film 17 having a thickness of 50 nm.

Figure 1D:
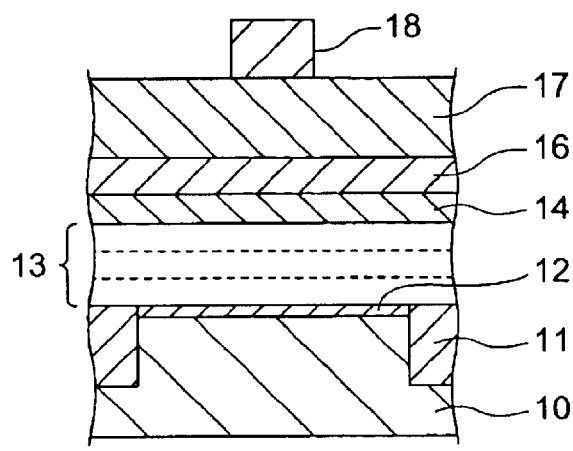

Subsequently, the gate electrode structure as described above is subjected to patterning. First, a 200-nm-thick silicon nitride (SiN) film 18 is deposited on the tungsten film 17 by a CVD technique, as shown in FIG. 1D. Then, a resist film not shown in the figure is formed thereon by coating, followed by patterning thereof to have a gate electrode pattern and by subsequent dry etching of the SiN film 18 to form an etching mask pattern 18.

Figure 1E:
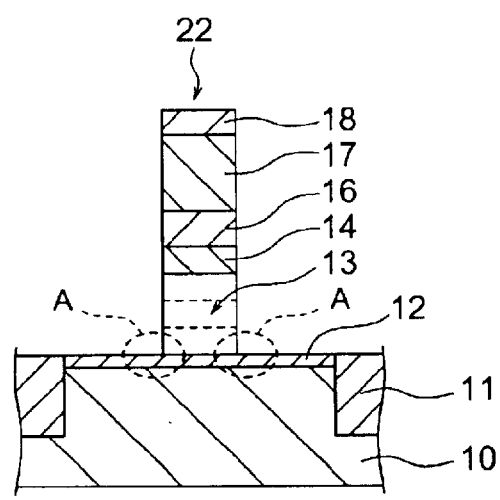

After removing the resist film pattern and subsequent washing, the tungsten film 17, tungsten nitride film 16, WSi$_2$ film 14 and DOPOS film 13 are selectively etched by a dry etching technique using the etching mask pattern 18 as a mask to form a gate electrode structure 22 as shown in FIG. 1E. In this step, since the portion of the gate oxide film 12 in contact with the edge of the gate electrode structure (shown by dotted circle) 22 is likely to be damaged by the dry etching, a heat treatment is conducted for improving the profile thereof.

Figure 1F:
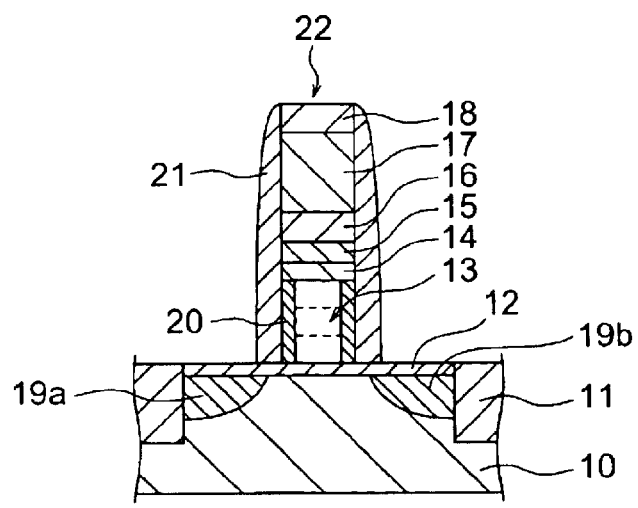

The heat treatment for improvement of the profile is such that the silicon wafer received in the chamber filled with hydrogen gas, steam and nitrogen gas is heated up to a temperature of 750 to 900 degrees C. to allow the silicon and the gate oxide film 12 to be selectively oxidized to restore the portion damaged by the dry etching. This thermal oxidation is conducted for about an hour to form a 5-nm-thick side-wall oxide films 20 at both the sides of the DOPOS film 13, as shown in FIG. 1F. The thermal oxidation also forms a tungsten nitride silicide (WSiN) film 15 having a thickness of 5 nm or less between the WSi$_2$ film 14 and the tungsten nitride film 16. It is to be noted a thickness above 5 nm for the tungsten nitride silicide film 15 increases the electric resistance of the WSiN film 15 to increase the interface resistance between the tungsten nitride film 16 and the DOPOS film 13.

Subsequently, a 40-nm-thick silicon nitride film is formed over the entire area of the gate electrode structure 22, followed by etch back thereof to form a side-wall silicon oxide film 21 on the gate electrode structure 22. Thereafter, a resist film not shown is formed to cover the nMOS area or a pMOS area of the silicon substrate 10, followed by implanting impurities into the silicon substrate 10 by a self-alignment technique using the gate electrode structure 22 including the side wall 21 as a mask.

In the implanting step, arsenic (As) is introduced through the gate oxide film 12 into the nMOS area of the silicon substrate 10 and boron difluoride (BF$_2$) is introduced through the gate oxide film 12 into the pMOS area of the silicon substrate 10, whereby heavily-doped source/drain diffused regions 19a and 19b are obtained in self-alignment with the gate electrode structure 22.

Subsequently, a heat treatment is conducted at a temperature of 900 to 1100 degrees C. by a RTA technique, thereby activating the impurities in the source/drain diffused regions 19a and 19b. This temperature of the heat treatment allows the WSiN film 15 formed between the WSi$_2$ film 14 and the tungsten nitride film 16 to further increase the thickness thereof.

In the present embodiment, the heat treatments for oxidation of both the sides of the gate electrode structure 22 and for activating the impurities in the source/drain diffuse regions 19a and 19b allow the WSiN film 15 having a small thickness to be formed without using a dedicated heat treatment for the WSiN film 15. This simplifies the process for forming a gate electrode structure 22 in the semiconductor device.

It is to be noted that the total thickness of the WSiN film 15 is obtained as the results of the heat treatments for the thermal oxidation of the side-wall structure and the impurity activation in the source/drain diffused regions as well as the other heat treatments conducted after the formation of the tungsten nitride film 16 on the WSi$_2$ film 14, and that the total thickness of the WSiN film 15 should be preferably between 2 and 5 nm. A thickness below 2 nm causes an insufficient barrier function, whereas a thickness above 5 nm causes a higher interface resistance between the tungsten nitride film 16 and the DOPOS film 13.

In the present embodiment, the presence of the WSi$_2$ film 14 prevents the reaction between the tungsten film 17 and the DOPOS film 13 as well as the reaction between the tungsten nitride film 16 and the DOPOS film 14, whereby a WSiN film 15 having a smaller thickness compared to the conventional technique can be obtained. This allows the tungsten nitride film 16 and the WSiN film 15 to effectively act as the diffusion barrier layers, thereby effectively preventing the reduction in the impurity concentration of the DOPOS film 13 caused by a heat treatment and suppressing the diffusion of the tungsten atoms from the tungsten film 17.

In addition, the smaller thickness of the WSiN film 15 and the presence of the WSi$_2$ film 14 between the WSiN film 15 and the DOPOS film 13 allows the interface resistance between the tungsten film 17 and the DOPOS film 13 to decrease in the gate electrode structure 22 having diffusion barrier layers. It is to be noted that the entire tungsten nitride film 16 may be converted to the WSiN film 15 depending on the time length and the temperature of the heat treatments.

In the present embodiment, all the deposited films are patterned as a whole to form the gate electrode structure between the steps of the deposition and the heat treatment of the layers. However, the patterning for the gate electrode structure may be conducted after the heat treatment for forming the WSiN film. In this case, for example, a heat treatment is conducted at a temperature of 750 to 1000 degrees C. for ten seconds by using a RTA technique directly after the sputtering of the tungsten nitride film 16 and the tungsten film 17, followed by the patterning for the gate electrode structure 22. The thickness of the WSiN film 15 is preferably controlled by controlling the heat treatments for oxidation and impurity activation as well as the other heat treatments after the formation of the tungsten nitride film 16 so that the resultant thickness of the WSiN film 15 resides between 2 and 5 nm.

In the present embodiment, tungsten is used as the refractory metal in the refractory metal silicide film (WSi$_2$ film) 14 and the refractory metal nitride film (tungsten nitride film) 16. The tungsten may be replaced by titanium (Ti), wherein TiSi$_2$ film and TiN film are formed instead of the WSi$_2$ film and the WN film 16, respectively.

In the above embodiment using tungsten as the refractory metal, a WSiN film 15 is formed by thermal treatments such as for forming the side wall. In the case of using Ti as the refractory metal, it is difficult to form a TiSiN film corresponding to the WSiN film 15 by using a heat treatment, as described in Patent Publication JP-A-2000-36593. It is recited in the publication that the gate electrode structure including Ti film, TiN film and tungsten film consecutively formed does not allow a TiSiN film having an effective diffusion barrier function to be formed.

Thus, a TiSiN film should be formed by a sputtering technique using TiSi$_2$ or TiSix as a target and conducted after the deposition of the DOPOS film, or may be formed by a CVD step in a mixture gas ambient including titanium tetrachloride (TiCl$_4$) and monosilane (SiH$_4$) to form a TiSi$_2$ film, and a subsequent sputtering step using Ti as a target in a mixture gas ambient including argon gas and nitrogen gas to form a TiN film, followed by a heat treatment to obtain the TiSiN film. In the latter technique, the TiSiN film has a crystalline structure and not an amorphous structure, and yet has an effective diffusion barrier function although this diffusion barrier function is somewhat lower than the diffusion barrier function of the WSiN film 15.

The first refractory metal in the refractory silicide film such as WSi$_2$ film 14 and in the refractory nitride film such as WN film 16 and the second refractory metal in the metallic film such as tungsten film 17 may be independently selected from the group consisting of tungsten, molybdenum, titanium and tantalum. Although tungsten is most suited in view of the barrier function and acid resistance property among other metals, the other metals recited herein achieve advantages of the present invention and provide a low-resistance gate electrode structure.

Figure 2:
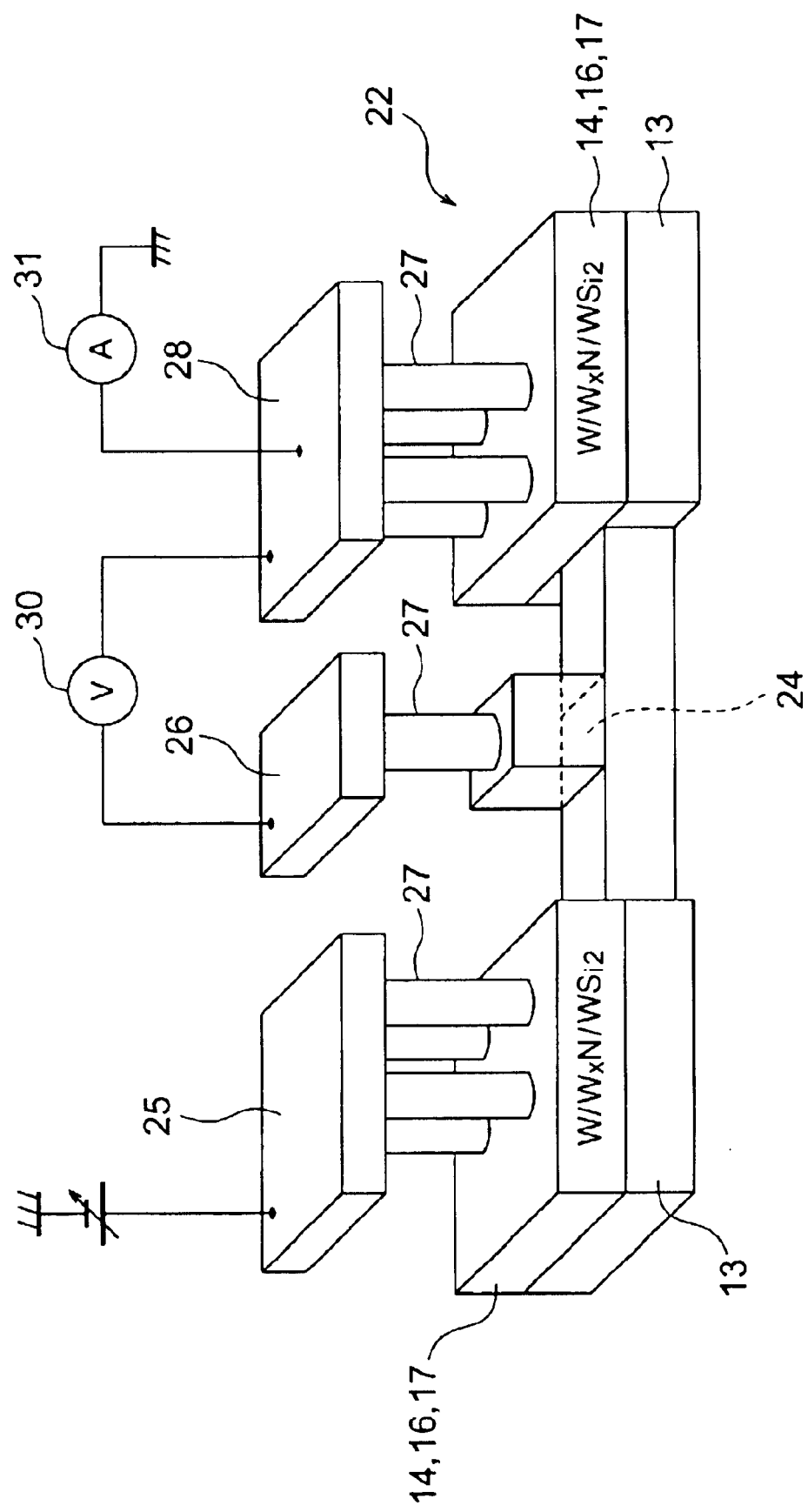
FIG. 2 is a perspective view of the semiconductor device of the embodiment during measurement of the sheet resistance thereof.

It was confirmed that the gate electrode structure as obtained by the method of the present embodiment exhibited a lower interface resistance between the tungsten nitride film 16 and the WSi$_2$ film 14 in the evaluation test for the interface resistance, such as shown in FIG. 2. Before the evaluation, an evaluation surface 24 of the interface portion of the DOPOS film 13 having an area of 1 $\mu$m×1 $\mu$m was exposed by removing the top metallic electrode including W/WxN/WSi$_2$ films 14, 16 and 17 of the gate electrode structure 22 obtained by the method of the embodiment.

In the evaluation, positive and negative voltages were applied at a voltage terminal 25 with respect to a ground terminal 28, which are electrically connected to areas of the top tungsten film 17 of the gate electrode structure 22 via plugs 27, the areas sandwiching therebetween the exposed evaluation surface 24 of the interface portion of the DOPOS film 13 conducting a penetrating current. The voltage between an evaluation terminal 26 connected to the exposed evaluation surface 24 via plugs 27 and the ground terminal 28 was measured by a voltmeter 30, whereas the penetrating current flowing through the interface portion of the DOPOS film 13 and the ground terminal 28 was also measured by an ammeter 31.

Figure 3:
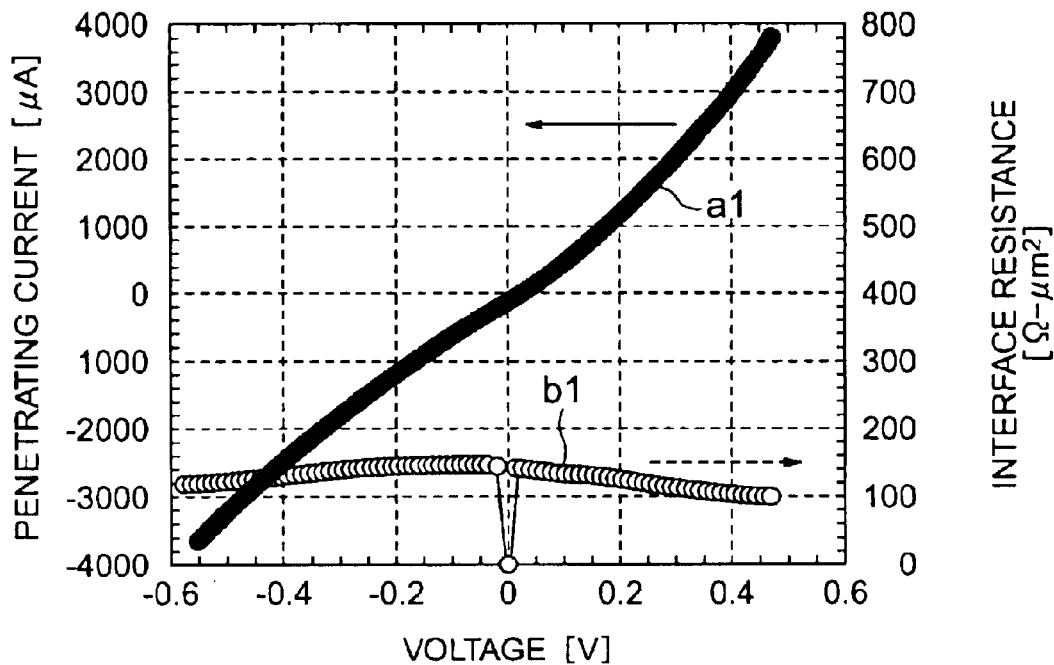
FIG. 3 is a graph showing the penetrating current characteristic of the interface in the gate electrode structure of the semiconductor device of the embodiment with respect to the applied voltage.
Figure 4:
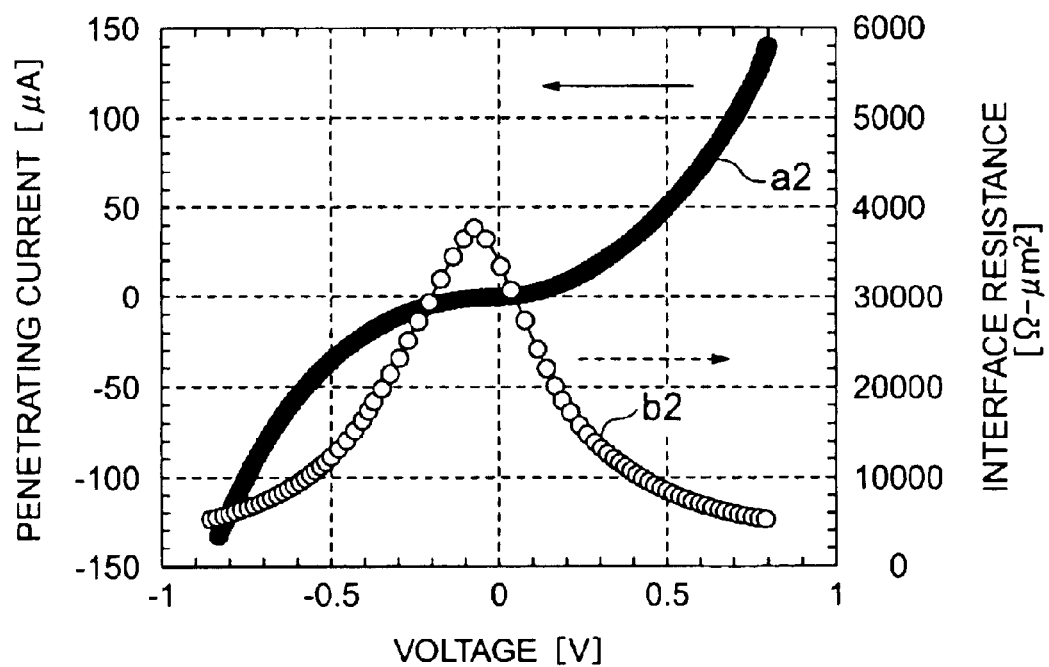
FIG. 4 is a graph showing the penetrating current characteristic of the interface in the gate electrode structure of a conventional semiconductor device with respect to the applied voltage.

FIG. 3 shows the result of the measured voltage-penetrating current characteristic obtained in the gate electrode structure 22 manufactured by the method of the embodiment, whereas FIG. 4 shows the result of the measured voltage-current characteristic of a comparative example having a conventional structure wherein WSi$_2$ film was not formed therein. In these graphs, the penetrating current ($\mu$A) is plotted against the measured voltage (volt) by curves a1 and a2, whereas the interface resistance is plotted against the measured voltage by curves b1 and b2.

As shown in FIG. 4, the gate electrode structure of the conventional technique exhibited a nonlinear characteristic of the penetrating current (a2) and an interface resistance (b2) nearly 400 $\Omega$-$\mu$m$^2$ in the vicinity of zero volts of the measured voltage. On the other hand, the gate electrode structure of the present embodiment exhibited a linear characteristics of the penetrating current (a1) and an interface resistance (b1) below 200 $\Omega$-$\mu$m$^2$ having a lower dependency upon the measured voltage.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a gate electrode in a semiconductor device, comprising the steps of:
   forming on a substrate, by a multi-stage deposition, a doped polysilicon (DOPOS) film having a crystal structure with multiple crystal orientations;
   consecutively depositing on said DOPOS film;
   a silicide film including a first refractory metal, a nitride film including said first refractory metal, and a metallic film including a second refractory metal; and
   heat treating the resulting structure as a whole whereby to form a nitride silicide of said first refractory metal having an amorphous structure.

2. The method according to claim 1, wherein each of said first and second refractory metals is independently selected from the group consisting of tungsten molybdenum and tantalum.

3. The method according to claim 1, wherein each of said first and second refractory metals is tungsten.

4. The method according to claim 1, wherein said nitride silicide of first refractory metal has a thickness of 2 to 5 nm.

5. The method according to claim 1, further comprising the step of patterning said layer structure as a whole in a single step between said layer structure fanning step and said heat treating step.

6. The method according to claim 1, further comprising the step of patterning said layer structure as a whole in a single step, wherein said heat treating step includes a first heat treating stop to form nitride silicide of said first refractory metal before said patterning step.

7. The method according to claim 6, wherein said heat treating step includes a second heat treating step to form a side-wall oxide film on said DOPOS film.

8. The method according to claim 7, wherein said heat treating step includes a third heat treating step for activating impurities in source/drain diffused regions of the substrate.

9. The method according to claim 1, wherein said heat treating step includes a first heat treating step to form a side-wall oxide film on said DOPOS film.

10. The method according to claim 9, wherein said heat treating step also includes a second heal treating step for activating impurities in source/drain regions of the substrate.

11. The method according to claim 1, wherein said layer structure forming step includes the steps of depositing said DOPOS film, said silicide film, said nitride film, and said metallic film, and introducing impurities into said DOPOS film through said silicide film after depositing said silicide film.

12. The method according to claim 1, wherein said silicide film has a thickness of 3 to 20 nm after deposition thereof.

13. The method according to claim 1, wherein said nitride film has a thickness of 5 to 20 nm after deposition thereof.

* * * * *

UNITED STATES PATENT AND TRADEMARK OFFICE
CERTIFICATE OF CORRECTION

PATENT NO. : 6,800,543 B2
DATED : October 5, 2004
INVENTOR(S) : Taguwa

It is certified that error appears in the above-identified patent and that said Letters Patent is hereby corrected as shown below:

Column 9,
Line 25, "structure fanning step" should be -- structure forming step --.

Column 10,
Line 15, "second heal treating" should be -- second heat treating --.

Signed and Sealed this

Eighteenth Day of January, 2005

JON W. DUDAS
*Director of the United States Patent and Trademark Office*